(12) United States Patent
Kushiya et al.

(10) Patent No.: US 8,242,795 B2
(45) Date of Patent: Aug. 14, 2012

(54) METHOD OF TESTING DURABILITY OF CIS BASED THIN-FILM SOLAR CELL MODULE

(75) Inventors: Katsumi Kushiya, Tokyo (JP); Satoru Kuriyagawa, Tokyo (JP)

(73) Assignee: Showa Shell Sekiyu K.K., Tokyo (JP)

( * ) Notice: Subject to any disclaimer, the term of this patent is extended or adjusted under 35 U.S.C. 154(b) by 587 days.

(21) Appl. No.: 12/298,721

(22) PCT Filed: Mar. 29, 2007

(86) PCT No.: PCT/JP2007/056993
§ 371 (c)(1),
(2), (4) Date: Oct. 27, 2008

(87) PCT Pub. No.: WO2007/129512
PCT Pub. Date: Nov. 15, 2007

(65) Prior Publication Data
US 2009/0072837 A1   Mar. 19, 2009

(30) Foreign Application Priority Data
May 1, 2006 (JP) .................................. 2006-127193

(51) Int. Cl.
*G01R 31/26* (2006.01)
(52) U.S. Cl. .................... 324/761.01; 324/501; 136/290; 136/244; 136/251; 136/252
(58) Field of Classification Search .................. 324/501, 324/761.01; 136/290
See application file for complete search history.

(56) References Cited

U.S. PATENT DOCUMENTS

| | | | | |
|---|---|---|---|---|
| 6,307,145 B1 * | 10/2001 | Kataoka et al. | ............... | 136/251 |
| 2005/0161075 A1 * | 7/2005 | Ogawa et al. | ................. | 136/251 |
| 2005/0227457 A1 * | 10/2005 | Kondo et al. | ................. | 438/479 |
| 2006/0240061 A1 * | 10/2006 | Atala et al. | .................... | 424/422 |

(Continued)

FOREIGN PATENT DOCUMENTS

JP    4-357885 A    12/1992

(Continued)

OTHER PUBLICATIONS

Thuillier et al.; The Solar Spectral Irradiance From 200 to 2400 nm As Measured by the Solspec Spectrometer from the Atlas and Eureca Missions; Jan. 15, 2003.*

(Continued)

*Primary Examiner* — Timothy J Dole
*Assistant Examiner* — Son Le
(74) *Attorney, Agent, or Firm* — Sughrue Mion, PLLC

(57) ABSTRACT

The property of CIS based thin-film solar cell modules that the modules recover their conversion efficiency, etc. upon irradiation with a weak light is correctly evaluated. A CIS based thin-film solar cell module is subjected to a conventional damp heat test with a constant-light solar simulator (solar simulator) 1D in such a manner that the power of the light source 1E is regulated so that the solar simulator 1D emits a weak light corresponding to the amount of solar radiation in cloudy weather, i.e., resulting in an irradiance of 100-300 W/m$^2$, and the module is continuously irradiated with the weak light throughout the test period under the same temperature, humidity, and storage period conditions as those in the conventional conditions for the test (1,000-hour storage in the dark at a temperature of 85° C. and a relative humidity of 85%). Thus, the property of the module 2' that the module 2' does not show considerable deterioration even after storage in an open state for 1,000 hours can be correctly evaluated.

3 Claims, 5 Drawing Sheets

FOREIGN PATENT DOCUMENTS

| | | |
|---|---|---|
| JP | 5-91681 A | 4/1993 |
| JP | 6-232438 A | 8/1994 |
| JP | 07-249790 A | 9/1995 |
| JP | 11-135811 A | 5/1999 |
| JP | 11-219734 A | 8/1999 |
| JP | 11-339867 A | 12/1999 |
| JP | 2000-31513 A | 1/2000 |
| JP | 2000-036331 A | 2/2000 |
| JP | 2001-077383 A | 3/2001 |
| JP | 2003-324211 A | 11/2003 |

OTHER PUBLICATIONS

Japanese Industrial Standard (JIS) C 8912:1998, First English edition published in Jan. 1999.

Japanese Industrial Standard (JIS) C 8911:1998, First English edition published in Feb. 1999.

Japanese Industrial Standard (JIS) C 8914:1998, First English edition published in Feb. 1999.

Japanese Industrial Standard (JIS) C 8913:1998, First English edition published in Jan. 1999.

International Electrotechnical Commission (IEC) International Standard 61646, Edition 2.0 May 2008.

Notification of Reasons for Refusal, issued by the Japanese Patent Office in corresponding Japanese Application No. 2006-127193 on Feb. 23, 2012.

* cited by examiner

CIS BASED THIN-FILM SOLAR CELL DEVICE 3'

METHOD OF TESTING DURABILITY OF CIS BASED THIN-FILM SOLAR CELL MODULE

TECHNICAL FIELD

The present invention relates to an improved method of testing the durability of a CIS based thin-film solar cell module.

BACKGROUND ART

The basic CIS based thin-film solar cell module proposed by the present applicants already came up to the IEC 61646 (International Electrotechnical Commission Standards 61646) (first edition). It is generally known that CIS based thin-film solar cell modules temporarily deteriorate in conversion efficiency through the 1,000-hour damp heat test as provided for in IEC 61646 (first edition) (test in which a sample is stored in the dark for 1,000 hours under the relatively high-temperature high-humidity conditions of a temperature of 85° C. and a relative humidity of 85%) but recover their conversion efficiency by light soaking after the test.

The durability test for a CIS based thin-film solar cell module is conducted by the method according to IEC 61646 (first edition). With respect to individual test items, however, tests are made according to solar-cell-related provisions in JIS (see non-patent document 1), for example, JIS C 8911: 1998 (secondary reference crystalline solar cells), JIS C 8912:1998 (solar simulators for examining crystalline solar cells), JIS C 8913:1998 (method of measuring output of crystalline solar cell), and JIS C 8914:1998 (method of measuring output of crystalline solar cell module).
Non-Patent Document 1: Taiyō Denchi Kanren JIS Mokuroku (published by Japanese Standards Association)

There actually is a report that a CIS based thin-film solar cell module which has undergone the damp heat test recovers its performance to at least 95% of the initial conversion efficiency upon irradiation with an intense light at an irradiance of 1,000 W/m$^2$ for a period of from 50 minutes to 300 minutes.

At present, the mechanism by which a CIS based thin-film solar cell module recovers by light soaking from the temporary deterioration resulting from the damp heat test has not been elucidated. This is one of the subjects left concerning the CIS based thin-film solar cell module technology.

In order to understand such a phenomenon, the applicants have made investigations on durability tests for CIS based thin-film solar cell modules based on the expectation that a CIS based thin-film solar cell module does not show any deterioration at all when subjected to a damp heat test while continuously irradiating the module with a light for a given time period throughout the test.

As stated above, CIS based thin-film solar cell modules have the following property. Although the modules show temporary deterioration in conversion efficiency after the conventional damp heat test in the dark for 1,000-hours, they recover the original conversion efficiency by light soaking after the test. There has been a problem that the durability of CIS based thin-film solar cell modules is not correctly evaluated by the conventional method of damp heat test.

DISCLOSURE OF THE INVENTION

Problem to be Solved by the Invention

The invention eliminates the problem described above. An object of the invention is to provide an improved durability test method which avoids the temporary deterioration in conversion efficiency of a CIS based thin-film solar cell module through the conventional damp heat test as provided for in IEC 61646 (first edition) (test in which a sample is stored in the dark for 1,000 hours under the relatively high-temperature high-humidity conditions of a temperature of 85° C. and a relative humidity of 85%) and which enables correct and stable property evaluation according to that property of CIS based thin-film solar cell modules by which the modules recover their solar cell characteristics including conversion efficiency by light soaking.

Means for Solving the Problem (1) The invention provides an improved method of testing the durability of a CIS based thin-film solar cell module, which is a durability test method capable of correctly evaluating a property of a CIS based thin-film solar cell module that the module recovers its conversion efficiency, etc. upon irradiation with a weak light, wherein a CIS based thin-film solar cell module whose durability is to be tested is subjected to a damp heat test which is a test in which a sample is stored in the dark for 1,000 hours under the relatively high-temperature high-humidity conditions of a temperature of 85° C. and a relative humidity of 85%, and that in conducting the damp heat test, the power of the xenon lamp or the like is regulated so that the constant-light solar simulator (solar simulator) emits a weak light resulting in an irradiance corresponding to the amount of solar radiation in cloudy weather and the module is continuously irradiated with the weak light throughout the test period under the same temperature, humidity, and storage period conditions to determine various solar cell characteristics.

(2) The invention provides the improved method of testing the durability of a CIS based thin-film solar cell module according to (1) above, wherein the module is irradiated with the weak light at an irradiance of 100-300 W/m$^2$.

(3) The invention provides the improved method of testing the durability of a CIS based thin-film solar cell module according to (1) or (2) above, wherein the CIS based thin-film solar cell module comprises a CIS based thin-film solar cell submodule obtained by electrically connecting a plurality of CIS based thin-film solar cell devices by patterning, a cover glass bonded to the submodule through a thermally crosslinked EVA resin film as an adhesive, a back sheet bonded to a back-side glass substrate of the submodule through a thermally crosslinked EVA resin film, a cable-possessing connection box or the like disposed beneath the back sheet, and a frame attached to the periphery of the resultant structure through a sealing material, wherein the CIS based thin-film solar cell devices each is a pn heterojunction device of a substrate structure which comprises a glass substrate and high-quality thin layers composed of an alkali barrier layer (which may be omitted), a metallic back electrode layer (generally molybdenum), a p-type CIS light absorbing layer, a high-resistance buffer layer, and an n-type window layer (transparent conductive film) which have been superposed in this order on the substrate, wherein the light absorbing layer is constituted of a multinary compound semiconductor thin film and made of a p-type semiconductor such as, in particular, a I-III-VI$_2$ Group chalcopyrite semiconductor, e.g., copper indium diselenide (CuInSe$_2$: hereinafter referred to as CISe), copper indium gallium diselenide (CuInGaSe$_2$: hereinafter referred to as CIGSe), copper gallium diselenide (CuGaSe$_2$: hereinafter referred to as CGSe), copper indium gallium diselenide-sulfide (Cu(InGa) (SSe)$_2$: hereinafter referred to as CIGSSe), copper indium disulfide (CuInS$_2$: hereinafter referred to as CIS), copper gallium disulfide (CuGaS$_2$: hereinafter referred to as CGS), copper indium gallium disulfide (CuInGaS$_2$: hereinafter referred to as CIGS), or copper indium gallium diselenide (CuInGaSe$_2$: CIGSe) having a thin film of copper indium gallium diselenide-sulfide (Cu(InGa) (SSe)$_2$: CIGSSe) as a surface layer.

Advantage of the Invention

The conventional durability test method based on the damp heat test as provided for in IEC 61646 (first edition) (test in which a sample is stored in the dark for 1,000 hours under the relatively high-temperature high-humidity conditions of a temperature of 85° C. and a relative humidity of 85%) failed to correctly and stably evaluate the characteristics of a CIS based thin-film solar cell module due to the temporary deterioration in conversion efficiency, etc. of the module. However, according to the improved durability test method of the invention, in which a CIS based thin-film solar cell module to be tested is stored under relatively high-temperature high-humidity conditions of a temperature of 85° C. and a relative humidity of 85% while continuously irradiating the module throughout the test period with a weak light corresponding to the amount of solar radiation in cloudy weather, it is possible to evaluate characteristics practically, correctly, and stably according to that property of CIS based thin-film solar cell modules by which the modules recover their solar cell characteristics including conversion efficiency.

DESCRIPTION OF THE REFERENCE NUMERALS AND SIGNS

Figure 1:
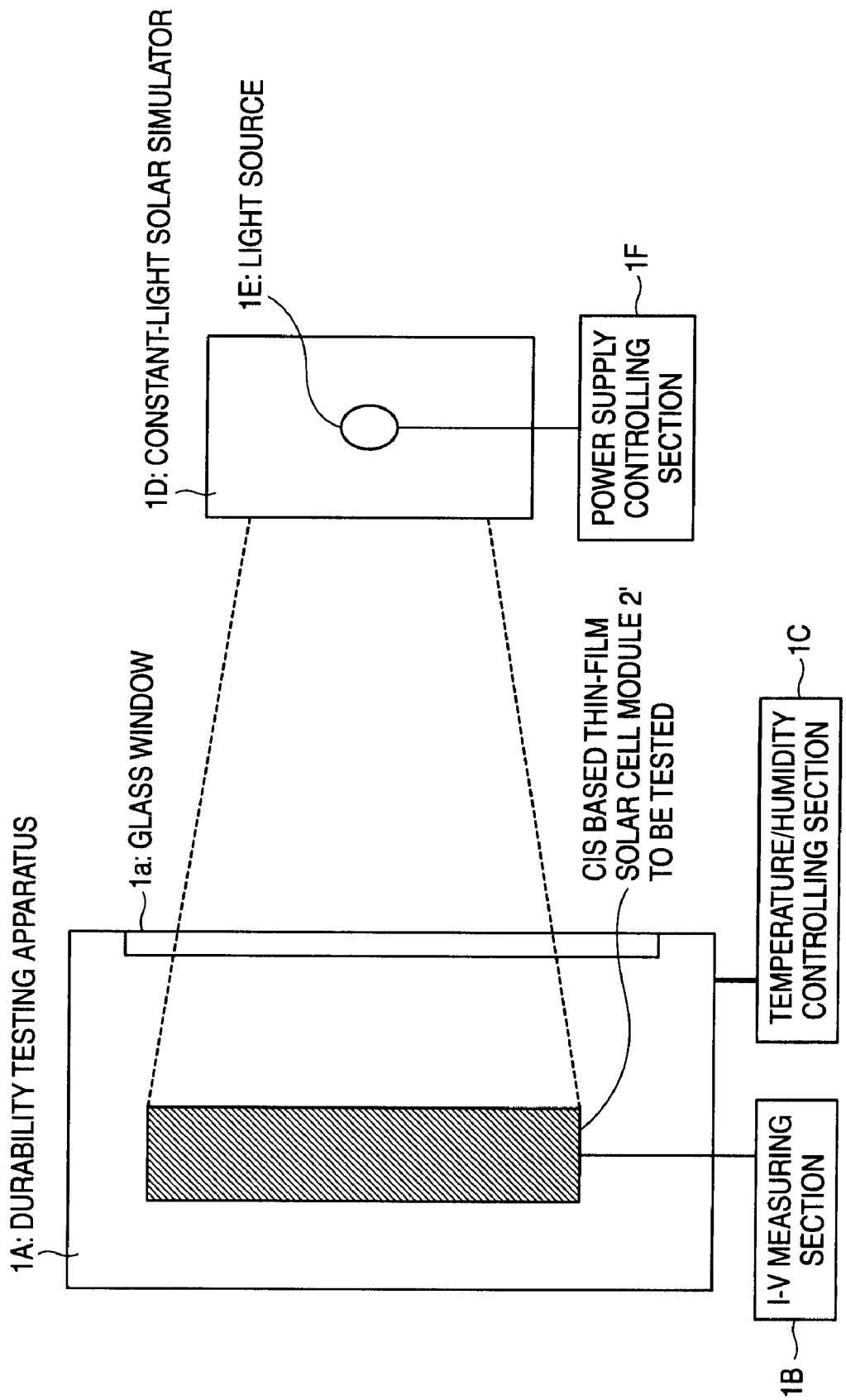
FIG. 1 is a diagrammatic view illustrating an improved method (or system) of the invention for testing the durability of a CIS based thin-film solar cell module.
Figure 2:
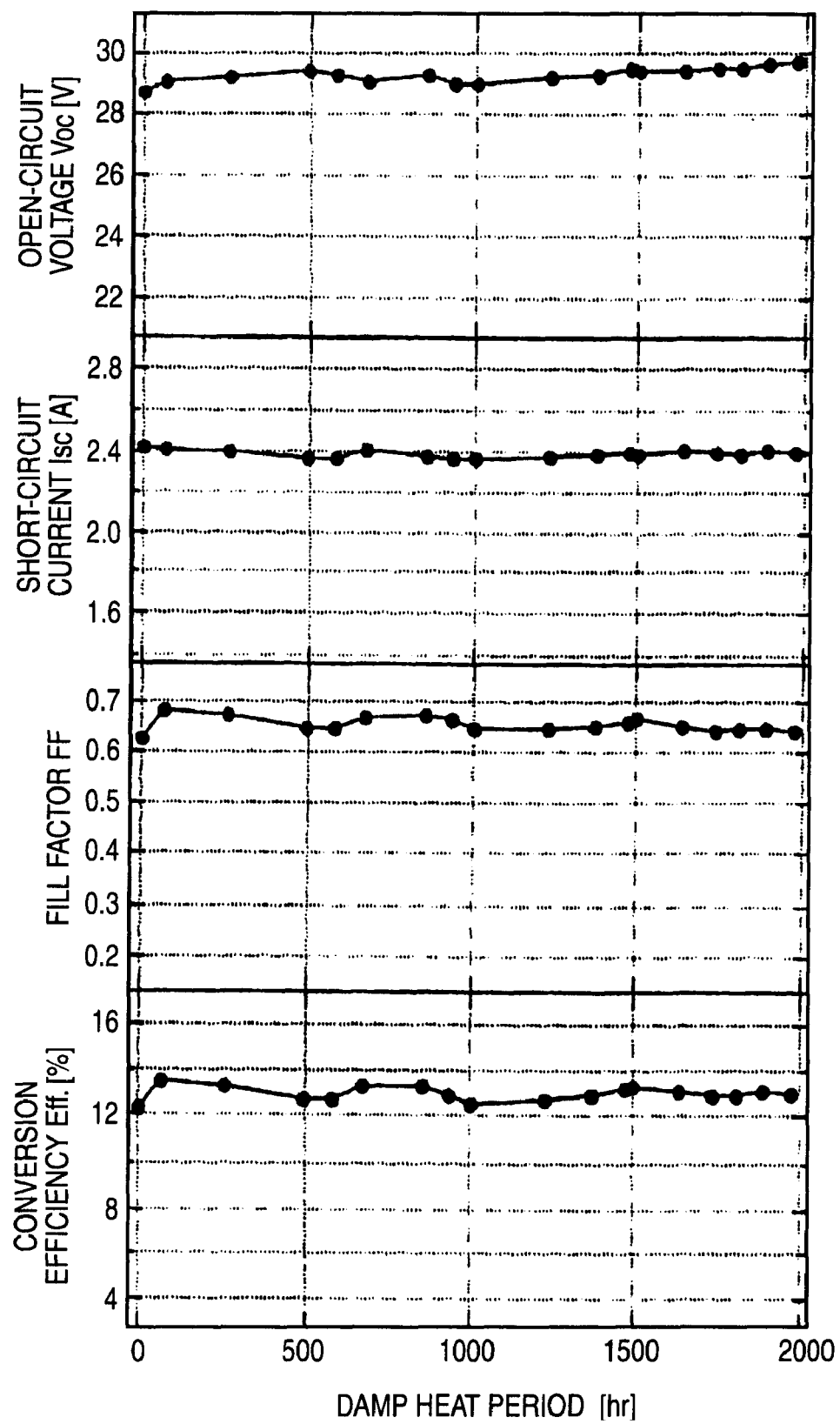
FIG. 2 is a presentation showing durability test results obtained by the improved durability test method of the invention.

1 improved durability test system
1A durability testing apparatus
1a glass window (light-transmitting window)
1B I-V measuring section
1C temperature/humidity controlling section
1D constant-light solar simulator
1E light source (xenon lamp)
1F power supply controlling section
2 CIS based thin-film solar cell module
2' CIS based thin-film solar cell module to be tested
3 CIS based thin-film solar cell submodule
3' CIS based thin-film solar cell device
3A glass substrate
3B alkali barrier layer
3C metallic back electrode layer
3D p-type light absorbing layer
3E high-resistance buffer layer
3F n-type window layer (transparent conductive film)
4 EVA resin film
5 cover glass
6 back sheet
7 junction box with cable
8 sealing material
9 frame

BEST MODE FOR CARRYING OUT THE INVENTION

The improved method of the invention for testing the durability of a CIS based thin-film solar cell module is a durability test method capable of correctly evaluating that property of a CIS based thin-film solar cell module by which the module recovers its conversion efficiency, etc. upon irradiation with a weak light.

Figure 3:
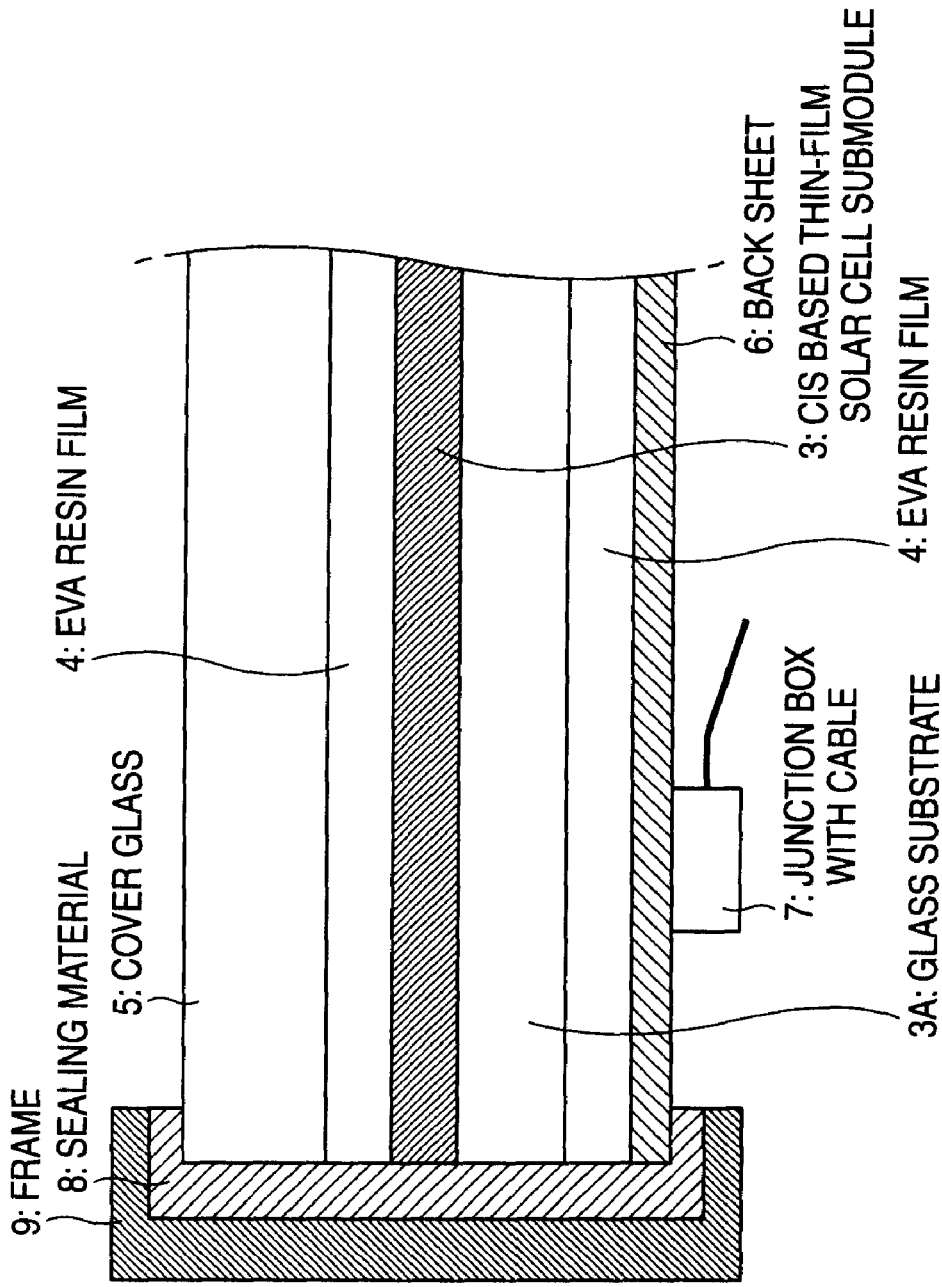
FIG. 3 is a diagrammatic view illustrating the constitution of a CIS based thin-film solar cell module to be tested by the improved durability test method of the invention.

As shown in FIG. 3, the CIS based thin-film solar cell module 2 to be subjected to the durability test of the invention has a structure composed of: a CIS based thin-film solar cell submodule 3 obtained by electrically connecting CIS based thin-film solar cell devices 3' (see FIG. 4) by patterning; a cover glass 5 bonded to the submodule 3 through a thermally crosslinked EVA resin film 4 as an adhesive; a back sheet 6 bonded to the back side of the submodule, i.e., to a glass substrate 3A, through a thermally crosslinked EVA resin film 4; and a junction box with cable 7 or the like disposed beneath the back sheet 6. A frame 9 is attached to the periphery of this structure through a sealing material 8.

Figure 4:
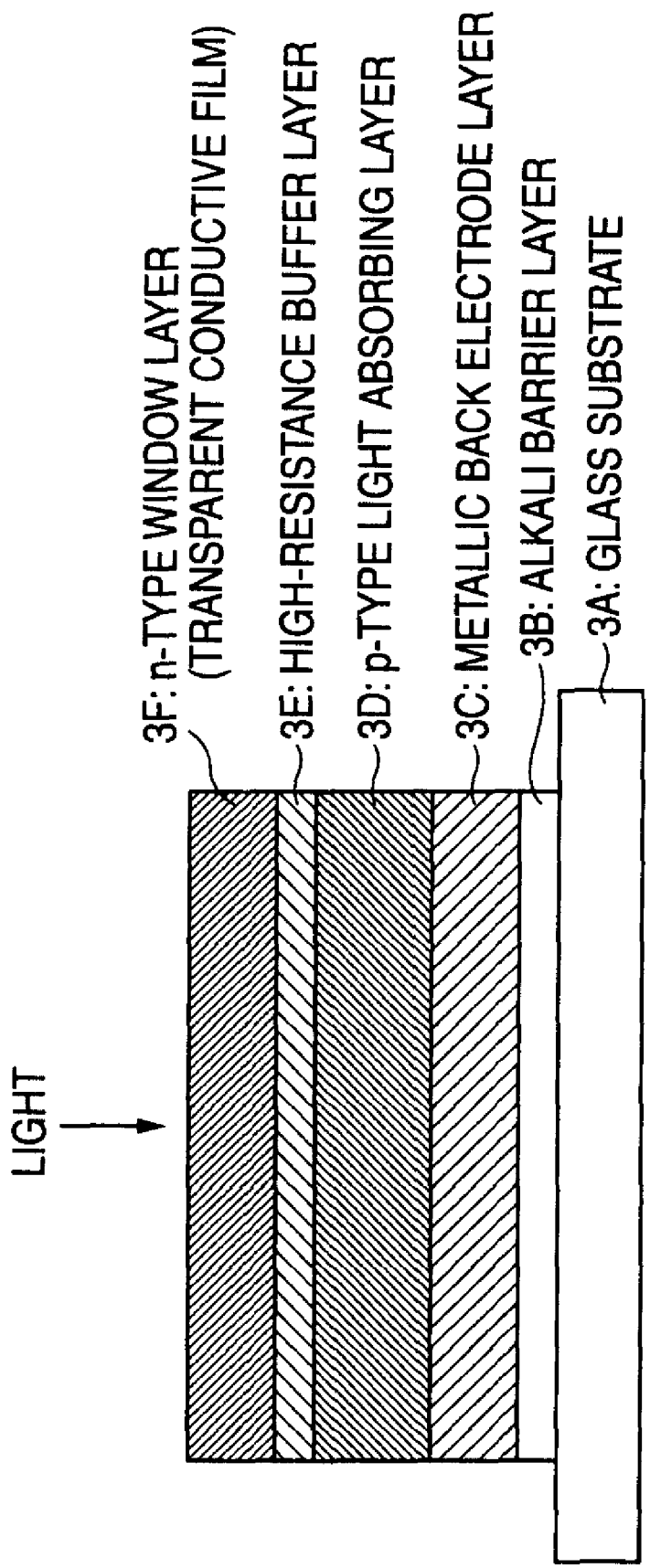
FIG. 4 is a diagrammatic view illustrating the constitution of a CIS based thin-film solar cell device as a constituent element for the CIS based thin-film solar cell module to be tested by the improved durability test method of the invention.
Figure 5:
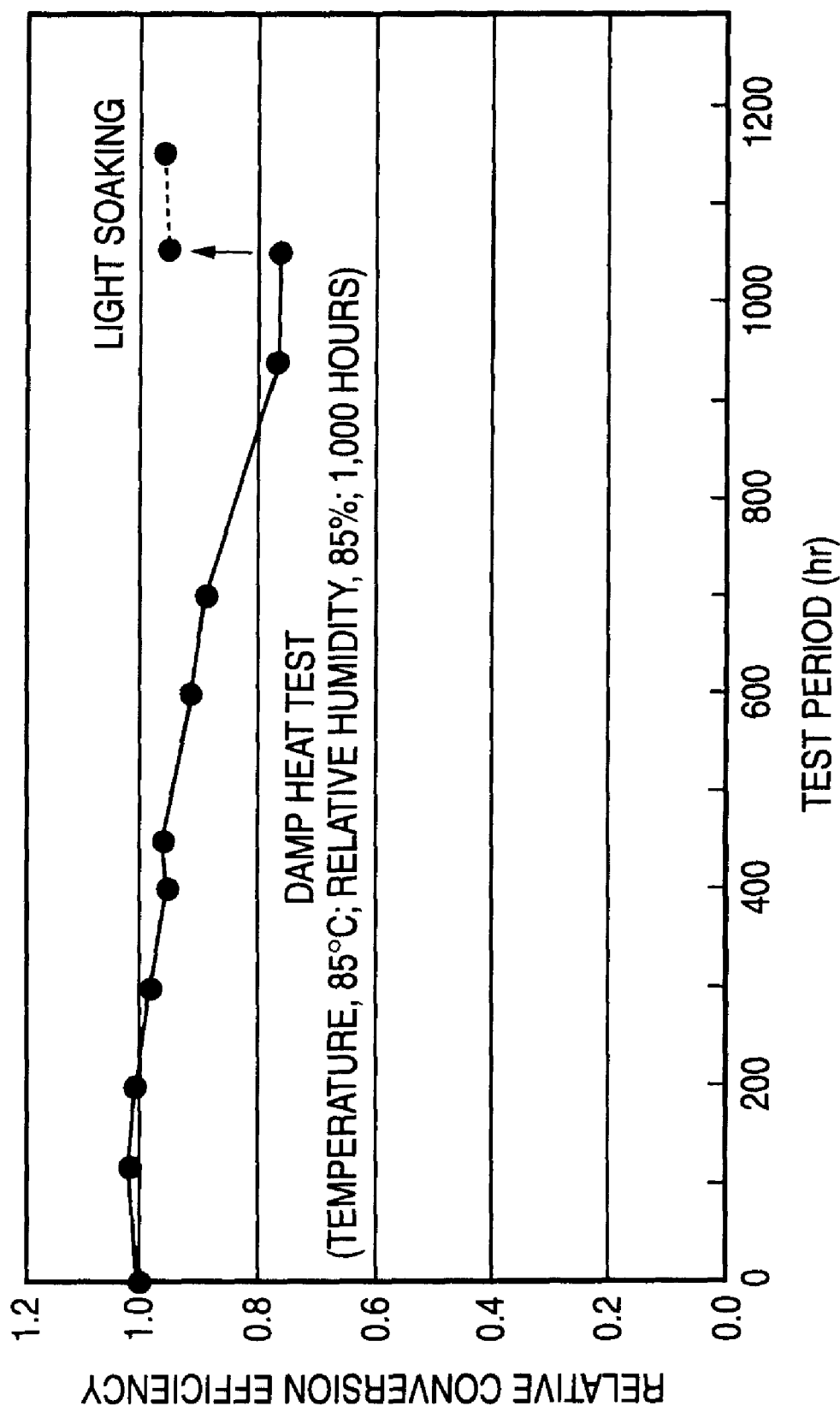
FIG. 5 is a presentation showing durability test results (conversion efficiency) obtained by the conventional durability test method as provided for in IEC 61646 (first edition).

The CIS based thin-film solar cell devices 3' each has the basic structure shown in FIG. 4. This device is a pn heterojunction device of a substrate structure which is constituted of a glass substrate 3A, e.g., a blue flat glass, and high-quality thin layers composed of an alkali barrier layer 3B (which may be omitted), metallic back electrode layer (generally molybdenum) 3C, p-type CIS light absorbing layer 3D, high-resistance buffer layer 3E, and n-type window layer (transparent conductive film) 3F which have been superposed in this order on the substrate 3A. The CIS light absorbing layer 3D is constituted of a multinary compound semiconductor thin film and is made of a p-type semiconductor such as, in particular, a I-III-VI$_2$ Group chalcopyrite semiconductor, e.g., copper indium diselenide (CuInSe$_2$: hereinafter referred to as CISe), copper indium gallium diselenide (CuInGaSe$_2$: hereinafter referred to as CIGSe), copper gallium diselenide (CuGaSe$_2$: hereinafter referred to as CGSe), copper indium gallium diselenide-sulfide (Cu(InGa)(SSe)$_2$: hereinafter referred to as CIGSSe), copper indium disulfide (CuInS$_2$: hereinafter referred to as CIS), copper gallium disulfide (CuGaS$_2$: hereinafter referred to as CGS), copper indium gallium disulfide (CuInGaS$_2$: hereinafter referred to as CIGS), or copper indium gallium diselenide (CuInGaSe$_2$: CIGSe) having a thin film of copper indium gallium diselenide-sulfide (Cu(InGa) (SSe)$_2$: CIGSSe) as a surface layer.

The improved method of the invention for testing the durability of a CIS based thin-film solar cell module is explained below.

The applicants expected that a CIS based thin-film solar cell module does not show any deterioration at all when subjected to a damp heat test while continuously irradiating the module with a light during the test, and have made investigations. For the purpose of ascertaining the expectation, an improved damp heat test was conducted in which the power of the xenon lamp or the like in a constant-light solar simulator (solar simulator) was regulated to thereby continuously irradiate a CIS based thin-film solar cell module throughout the test period with a weak light at an irradiance of 100-300 W/m², which corresponds to the amount of solar radiation in cloudy weather.

The improved method of the invention for testing the durability of a CIS based thin-film solar cell module is a durability test method capable of correctly evaluating that property of CIS based thin-film solar cell modules, such as that shown in FIG. 3, by which the modules recover their conversion efficiency, etc. upon irradiation with a weak light. A CIS based thin-film solar cell module to be subjected to the durability test is subjected to a damp heat test (moisture resistance test) which is a test in which a sample is stored in the dark for 1,000 hours under the relatively high-temperature high-humidity conditions of a temperature of 85° C. and a relative humidity of 85%. In conducting the damp heat test, the power of the xenon lamp or the like is regulated so that the constant-light solar simulator (solar simulator) emits a weak light corresponding to the amount of solar radiation in cloudy weather, i.e., resulting in an irradiance of about 100-300 W/m², and the module is continuously irradiated with the weak light throughout the test period under the same temperature, humidity, and storage period conditions to determine various solar cell characteristics. Thus, that property of the CIS based thin-film solar cell module by which the module does not show considerable deterioration even through storage in an open state over the test period is correctly evaluated. Incidentally, CIS based thin-film solar cell modules in which the plus and minus cables are in an open state are apt to recover.

In order to practice the improved method of the invention for testing the durability of a CIS based thin-film solar cell module, a test was conducted using an improved durability test system 1 such as that shown in FIG. 1. This improved durability test system 1 includes a durability testing apparatus 1A of closed structure, part of which has a glass window 1a for light soaking (light transmission). The inside of the durability testing apparatus 1A is regulated with a temperature/humidity controlling section 1C so as to have a temperature of 85° C. and a relative humidity of 85%. The light-receiving side of a CIS based thin-film solar cell module 2' stored as a specimen in the durability testing apparatus 1A is continuously irradiated, throughout a test period, with a weak light corresponding to the amount of solar radiation in cloudy weather, i.e., resulting in an irradiance of about 100-300 W/m², emitted by, e.g., a xenon lamp as a light source 1E disposed in a constant-light solar simulator (solar simulator) 1D installed at a given distance from the durability testing apparatus 1A. The light is regulated by regulating electric energy with a power supply controlling section 1F. This CIS based thin-film solar cell module 2' which is being irradiated with the light is examined for current and voltage with an I-V measuring section 1B over a test period of 1,000 hours to obtain solar cell characteristics data (conversion efficiency, fill factor, open-circuit voltage, and short-circuit current).

An example of the test results obtained by the improved durability test method employing the durability test system 1 is shown below.

In the improved high-temperature high-humidity storage method, when the CIS based thin-film solar cell module 2' as a specimen having a sandwich structure including a cover glass/EVA resin/CIS based thin-film solar cell submodule/glass substrate (see FIG. 3) was continuously irradiated with a weak light at 100-300 W/m² throughout the test period, then this solar cell module 2', which was stored in an open-end state, showed considerably reduced deterioration in solar cell characteristics (conversion efficiency Eff [%], fill factor FF, short-circuit current Isc [A], and open-circuit voltage Voc [V]) even after completion of the test period of 1,000 hours.

It is thought from these results that to apply the test as provided for in IEC 61646 described above in which a sample is stored under the current damp heat test conditions for the given period, i.e., the test in which a sample is stored in the dark for 1,000 hours under the relatively high-temperature high-humidity conditions of a temperature of 85° C. and a relative humidity of 85%, to a CIS based thin-film solar cell module 2 is not suitable in view of the conditions under which CIS based thin-film solar cell modules are actually used or stored.

In an outdoor exposure test, the CIS based thin-film solar cell module 2 proposed by the applicants showed completely no deterioration in output performance after 3-year exposure so long as the structure of the module completely satisfied production standards concerning package formation or module formation.

In particular, the mechanism by which light soaking brings about a recovery of conversion efficiency or the effect of light soaking should be understood. Compared to the current damp heat test, the improved durability test of the invention employs conditions which are extremely akin to actual outdoor exposure conditions for CIS based thin-film solar cell modules 2. Consequently, the values of output obtained in this improved test should be regarded as more practical than output values obtained after the current damp heat test.

As described above, the conventional damp heat test (durability test) method base on the damp heat test as provided for in IEC 61646 (first edition) (test in which a sample is stored in the dark for 1,000 hours under the relatively high-temperature high-humidity conditions of a temperature of 85° C. and a relative humidity of 85%) failed to correctly and stably evaluate the characteristics of a CIS based thin-film solar cell module 2 due to that property of the module by which it temporarily deteriorates in conversion efficiency, etc. In contrast, according to the improved durability test method of the invention, in which a CIS based thin-film solar cell module 2 to be tested is stored under relatively high-temperature high-humidity conditions of a temperature of 85° C. and a relative humidity of 85% while continuously irradiating the module throughout the test period with a weak light, it is possible to evaluate characteristics practically, correctly, and stably according to that property of CIS based thin-film solar cell modules by which the modules recover their solar cell characteristics including conversion efficiency.

As stated above, CIS based thin-film solar cell modules have the following property. The modules temporarily deteriorate in conversion efficiency through the 1,000-hour damp heat test (test in which a sample is stored in the dark for 1,000 hours under the relatively high-temperature high-humidity conditions of a temperature of 85° C. and a humidity of 85%) but recover their conversion efficiency upon continuous irradiation with a weak light after the test. A method (or device) for storing or managing CIS based thin-film solar cell modules is explained below which is suitable for that property of CIS based thin-film solar cell modules 2.

During a storage period from the production of CIS based thin-film solar cell modules 2 to installation thereof, the light-receiving side of each CIS based thin-film solar cell module 2 is continuously irradiated with a weak light corresponding to the amount of solar radiation in cloudy weather, i.e., resulting in an irradiance of about 100-300 W/m². As a result, the deterioration (decrease) in conversion efficiency, etc. of each CIS based thin-film solar cell module 2 can be prevented (avoided), and a maximum conversion efficiency, etc. can be obtained from the beginning immediately after installation.

The light source is not limited to a xenon lamp, and an appropriate light source can be suitably selected while taking account of other cost and performance.

By continuously irradiating the CIS based thin-film solar cell modules 2 with a weak light during the storage thereof, solar cell characteristics including conversion efficiency can be maximized. It is therefore preferred to employ a storage device or storage container which has such a structure that the contents are irradiated with sunlight in the daytime, e.g., a structure in which the roof or a wall is made of a suitable transparent material which transmits sunlight, such as a glass or plastic, and which is provided with the artificial light source for the night. In the night, the light-receiving side of each CIS based thin-film solar cell module 2 is illuminated at an irradiance of about 100-300 W/m$^2$ with the light source and using a light-reflecting or light-scattering device.

When the CIS based thin-film solar cell modules 2 are stored, the modules 2 may be placed in such a manner that the back side, i.e., the side opposite to the light-receiving side, of each module is in contact with the back side of another module. Thus, the light-receiving sides of the modules are evenly illuminated.

Also in the case of transporting the CIS based thin-film solar cell modules 2 to an installation site, the placement method and transparent packaging material for use in the storage may be applied to place the modules so that the back side, i.e., the side opposite to the light-receiving side, of each module is in contacted with the back side of another module. Thus, the light-receiving sides of the modules are evenly illuminated, and a maximum conversion efficiency, etc. can be obtained from the beginning immediately after installation.

The invention claimed is:

1. An improved method of testing the durability of a CIS based thin-film solar cell module, which is a durability test method capable of correctly evaluating a property of a CIS based thin-film solar cell module that the module recovers its conversion efficiency upon irradiation with a weak light, wherein a CIS based thin-film solar cell module whose durability is to be tested is subjected to a damp heat test which is a test in which a sample is stored in the dark for 1,000 hours under the relatively high-temperature high-humidity conditions of a temperature of 85° C. and a relative humidity of 85%, and that in conducting the damp heat test, the power of a xenon lamp is regulated so that the constant-light solar simulator (solar simulator) emits a weak light corresponding to the amount of solar radiation in cloudy weather and the module is continuously irradiated with the weak light throughout the test period under the same temperature, humidity, and storage period conditions to determine various solar cell characteristics, and wherein the module is irradiated with the weak light at an irradiance of 100-300 W/m$^2$.

2. The improved method of testing the durability of a CIS based thin-film solar cell module according to claim 1, wherein the CIS based thin-film solar cell module comprises a CIS based thin-film solar cell submodule obtained by electrically connecting a plurality of CIS based thin-film solar cell devices by patterning, a cover glass bonded to the submodule through a thermally crosslinked EVA resin film as an adhesive, a back sheet bonded to a back-side glass substrate of the submodule through a thermally crosslinked EVA resin film, a cable-possessing connection box disposed beneath the back sheet, and a frame attached to the periphery of the resultant structure through a sealing material, wherein the CIS based thin-film solar cell devices each being a pn heterojunction device of a substrate structure which comprises a glass substrate and high-quality thin layers composed of an alkali barrier layer, a metallic back electrode layer (generally molybdenum), a p-type CIS light absorbing layer, a high-resistance buffer layer, and an n-type window layer (transparent conductive film) which have been superposed in this order on the substrate, wherein the light absorbing layer is constituted of a multinary compound semiconductor thin film and made of a p-type semiconductor.

3. The improved method of testing the durability of a CIS based thin-film solar cell module according to claim 2, wherein the p-type semiconductor is a I-III-VI$_2$ Group chalcopyrite semiconductor.

* * * * *